United States Patent [19]

Jonker et al.

[11] 4,343,542

[45] Aug. 10, 1982

[54] SMOOTHING DEVICE FOR SCAN LINES OF A PHOTOGRAPHED CRT DISPLAY

[75] Inventors: Roelof R. Jonker, Westminster; Dennis A. Webb, Culver City, both of Calif.

[73] Assignee: N.I.S.E., Inc., Cerritos, Calif.

[21] Appl. No.: 280,885

[22] Filed: Jul. 6, 1981

[51] Int. Cl.³ .................... G01D 9/42; G03B 29/00; H04N 5/84

[52] U.S. Cl. ................... 354/76; 346/110 R; 358/244

[58] Field of Search ............... 358/130–132, 358/244, 249, 251; 354/6, 75, 76; 346/110 R

[56] References Cited

U.S. PATENT DOCUMENTS 3,145,264 8/1964 Schulz ....................... 358/251
4,027,315 5/1977 Barney ....................... 354/76

OTHER PUBLICATIONS

Shelkofsky, C. I., "Adjustable Mount for CRT Terminal", IBM Tech. Disc. Bull., 21(3), 8/1978, pp. 1147, 1148.

Primary Examiner—John Gonzales
Attorney, Agent, or Firm—Boniard I. Brown

[57] ABSTRACT

A device for mechanically moving the instantaneous image spot of a cathode ray tube at right angles to the scan direction with respect to a photographic film on which the total image is recorded by vibrating a portion of the imaging system so that the spot moves at a higher relative speed at right angles than at the normal scan direction so that the information on one scan line occupies all, or very nearly all, of the space between the scan lines as they are projected on the film.

28 Claims, 11 Drawing Figures

SMOOTHING DEVICE FOR SCAN LINES OF A PHOTOGRAPHED CRT DISPLAY

BACKGROUND OF THE INVENTION

Certain types of cathode ray tube (CRT) displays consist of distinct separated lines of information. Two modalities presently using this method for displaying continuous tone or grey scale images are raster-scan systems and real time ultrasound displays. In raster-scan systems, the electron beam in the CRT traces a sequence of horizontal or vertical lines which cover the tube face. This pattern is continually repeated while the beam intensity is modulated to produce an image. If viewed from a sufficient distance or if the electron beam is sufficiently out of focus, the lines disappear and the appearance of a continuous image is produced. This is generally known as a television display. The number of scan lines has been standardized at 525 or 650, although greater or fewer lines may be used so that more or less information is displayed during a single illumination of the screen. The entire screen usually is rescanned from 30 to 40 times per second so that "flicker" is not apparent to an observer.

In real time ultrasound displays, the pattern is again made up of a modulated beam repeating a sequence of lines. However, in real time ultrasound displays these lines may be parallel, or can extend radially from a point producing a sector-shaped or circular shaped pattern.

When resolution of fine detail is important, as it is in medical applications, the spaces between the raster or scan lines break up the image, interfering with the observation of fine detail. It is highly desirable that a true continuous tone be presented to the observer so that the image has no observable lines. This can be accomplished by greatly increasing the number of horizontal lines. However, such is extremely expensive as it requires a much wider frequency spectrum in the electronics producing the image. In applications where it is important for an observer to obtain detailed information from these displays, a photograph of the CRT image normally is taken so that a number of images can be observed at different locations and times. These photographs are also retained as permanent records of the displayed information. As with direct visual viewing, it is desirable that the recorded image appear to be a solid continuous tone rather than made up portions of parallel lines of different brightness. With photographs the aforementioned distinct lines making up the image will appear as a continuous tone if the image can be blended as the photographic film is being exposed. This increases the effective resolution and therefore analytical value of the displayed information on the photographs.

BRIEF DESCRIPTION OF THE PRESENT INVENTION

In the present invention, mechanical means are employed to move the image at right angles to the scan lines so that the space between the scan lines is filled up on a recording photographic plate. This is accomplished by moving one or more portions of the imaging system whether it be the CRT, focusing lens, film or optional reflector by means of drive means such as a motor, solenoid or other electrical-mechanical device which preferably is controllable in its movement producing frequency.

It is therefore an object of the present invention to provide mechanical means for smoothing cathode ray scan lines.

Another object is to provide a continuous tone view on a photographic plate of a cathode ray tube raster such as used in ultrasound displays.

Another object is to fill in a CRT image between scan lines on a photographic plate by mechanically moving the image at right angles to the scan direction so that the resultant exposure appears to be a continuous tone.

Another object is to provide cathode ray scan line smoothing which is relatively economic, is adaptable to various applications and can be accomplished without interfering with the electronics or bandpass of an existing cathode ray tube display system.

Another object is to provide CRT smoothing to a cathode ray tube display which is accomplished in the photographic image processing thereof.

These and other objects and advantages of the present invention will become apparent to those skilled in the art after considering the following detailed specification which covers preferred embodiments thereof in conjunction with the accompanying drawings wherein:

DETAILED DESCRIPTION OF THE SHOWN EMBODIMENTS

Figure 1:
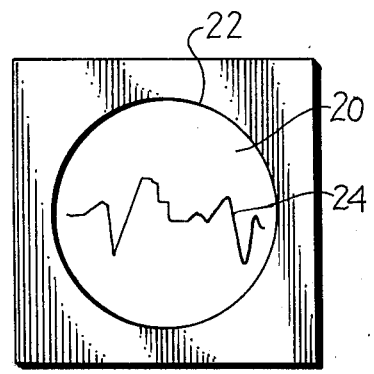
FIG. 1 is a front view of a cathode ray tube having an image thereon.
Figure 2:
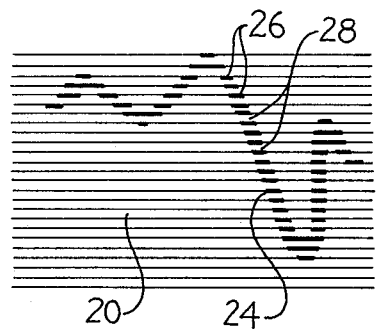
FIG. 2 is an enlarged view of a portion of the image in FIG. 1, showing the effect of a scan display, the darkest lines of FIG. 2 representing the most intense light produced by the CRT.

Referring to the drawings more particularly by reference numbers, number 20 in FIG. 1 refers to the face of a cathode ray tube (CRT) 22 on which an image 24 is shown. For convenience, the image 24 is shown dark with respect to the face 20; however, in the actual CRT display, the image 24 would be the lightest area on the face 20. A typical way of producing the image 24 is to scan an electron beam across the face 20 of the CRT 22 varying its intensity as it scans. This is shown in FIG. 2 and results in discrete scan lines 26 which like in FIG. 1 are shown dark instead of light for convenience. As can be seen, there are spaces 28 between adjacent scan lines so that the image 24 produced thereby gives the visual impression of a series of parallel unconnected lines rather than that of a single image. The problem of observation of the scan lines 26 may be reduced by defocusing the electron spot so that the areas between the scan lines 26 become filled in. Unfortunately, in quality CRT displays, such as those used in medical applications, this defocusing results in data loss as sharp edges due to changes in intensity are lost.

Figure 3:
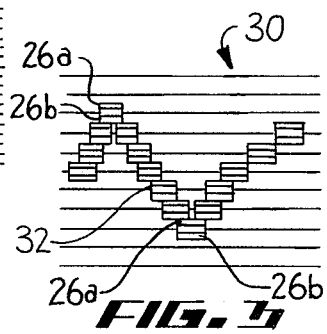
FIG. 3 is an enlarged view of the image of FIGS. 1 and 2 as it appears on the photographic negative after processing by the present invention.
Figure 4:
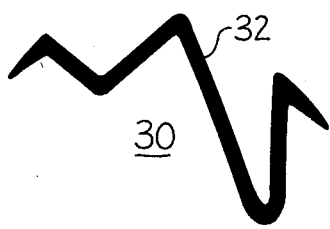
FIG. 4 is a view in the scale of FIG. 2 of the negative of a photograph plate exposed by the image of FIG. 2 after processing by the present invention.

In medical imaging applicatons such as ultrasound, it is typical that the image is reproduced by many scans and, therefore, it is possible to shift successive images with respect to an image recording photographic plate 30 so that the scan lines 26, 26a, and 26b are shifted at right angles to their normal scann direction. This technique is shown in FIG. 3 and can produce a high quality image 32 with all its detail as shown in FIG. 4 for recording on the plate 30.

Figure 5:
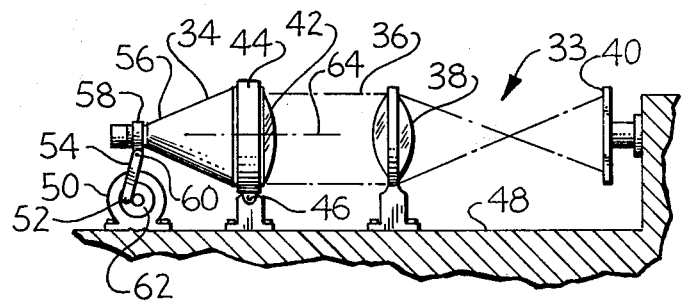
FIG. 5 is a typical embodiment of the present invention shown in diagrammatic form employing CRT motion means.

A typical imaging system 33 for producing a photographic record of the image on a CRT is shown in FIG. 5. The system 33 is comprised of a CRT 34 whose light output 36 is focused by a lens 38 onto a photographic plate 40. The light output 36 consists of scan lines which extend horizontally across the face 42 of the CRT 34 in the orientation shown. The CRT 34, as shown, is pivotally mounted by means of a strap 44 and a pivot 46 to structure 48. A movement producing device such as a controllable drive motor 50, is connected by means of a crank 52 and a connecting rod 54 to the neck 56 of the CRT 34 by a second strap 58 and a pivot 60. Rotation of the motor 50 causes the crank 52 to follow a circular path 62, which motion is transmitted by the connecting rod 54 to the neck 56 of the CRT 34 to rock it about the pivot 46. For a precise system, the pivot 46 would be located on the center line 64 of the CRT 34. However, FIG. 5 is only diagrammatic as to the amount of motion imparted by the drive motor 50 and, in fact, the motion required is very slight so that the slight geometry difference that results from the off axis pivot point usually is negligible. The motion of the CRT 34 causes its output image to move slightly with respect to the lens 38 which focuses the light output 36 of the CRT 34 onto the photographic plate with a predetermined amount of vertical displacement so that the distance between scan lines 26 is filled in by successive scan lines 26a and 26b as shown in FIG. 3.

This result also can be accomplished in other ways. For example, in the system 66 of FIG. 6, a drive motor 68 has an off-center crank 70 connected to a pivoted lens 72 by a connecting rod 74. The lens 72 is shown pivoted about a centrally located pivot 76 perpendicular to the focal axis 77 of the lens 72. Rotation of the drive motor 68 causes the lens 72 to rock back and forth and displace the scan lines from a fixed CRT 78 in a vertical direction so that upon reflection by a mirror 80, the scan lines move at right angles to their normal scan direction on a photographic plate 82 so that the image that exposes the plate 82 is that of the type shown in FIG. 3.

Figure 7:
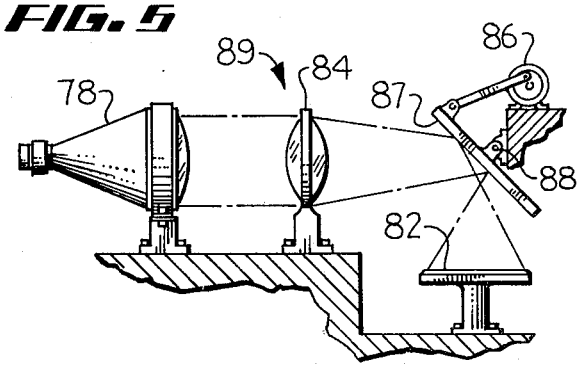
FIG. 7 is another embodiment of the present invention shown in diagrammatic form employing reflective mirror moving means.

When a fixed CRT 78 and fixed lens 84 are desired, a drive motor 86 can be employed to rock a reflective element such as pivoted mirror 87 about a centrally located pivot point 88 as shown in system 89 of FIG. 7. This will cause the output image to move right and left on the fixed photographic plate 82 in the orientation of FIG. 7 while the scan forms the image into and out of the drawing at right angles.

Figure 8:
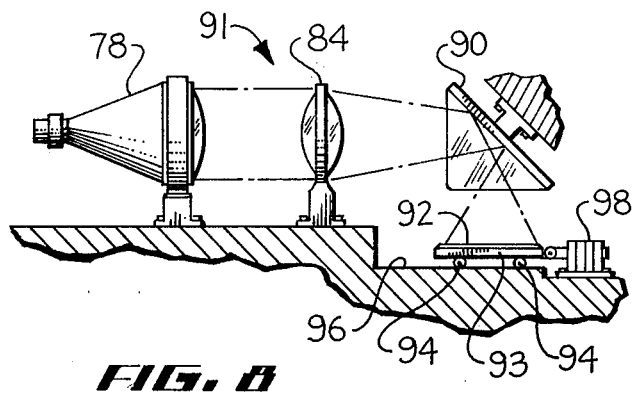
FIG. 8 is another embodiment of the present invention shown in diagrammatic form employing film moving means.
Figure 9:
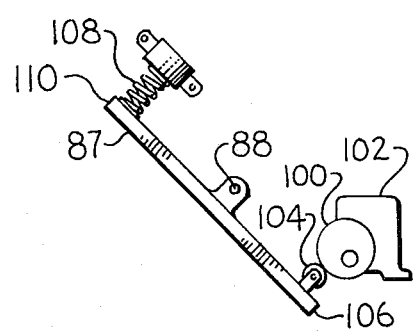
FIG. 9 is an enlarged detailed view of modified means for moving an image reflecting mirror for the device of FIG. 7.

In FIG. 8, the fixed CRT 78 and fixed lens 84 are combined with a fixed reflecting prism 90 so that in the system 91, the instantaneous light output produced by the CRT 78 does not move right and left. Instead relative motion between the light output and the image recording film 92 is provided by mounting the film holder 93 on rollers 94 on a surface 96 parallel to the direction it is desired to displace the image on the film 92. The movement of the film 92 is accomplished by means of a solenoid 98. The solenoid 98 can be double acting as shown, or a spring may move the film holder 93 in one direction after the solenoid 98 movesit in the opposite direction. This principle is shown with respect to FIG. 9 wherein the pivoting mirror 87 has been provided with drive means which include an eccentric cam 100 rotated by a drive motor 102 against a rotary cam follower 104 mounted adjacent an edge 106 of the mirror 86. A compression spring 108 on the opposite end 110 of the mirror keeps the cam follower 104 in contact with the cam 100 so that the mirror 86 rocks about the pivot 88 in response to rotation of the cam 100.

Figure 10:
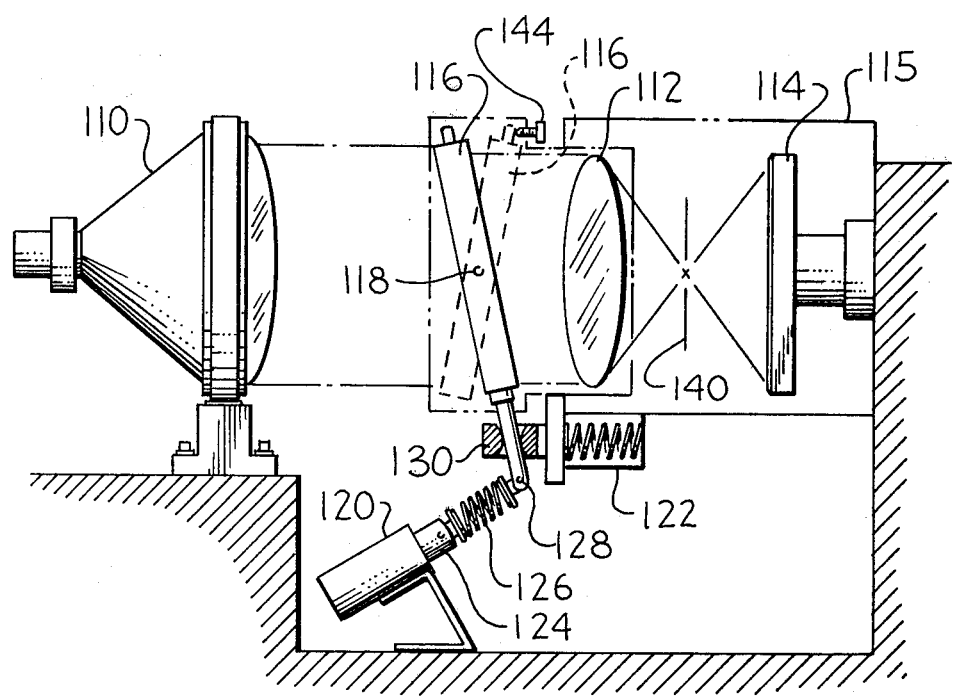
FIG. 10 is another embodiment of the present invention shown in diagrammatic form employing a solenoid actuated image shifter.
Figure 11:
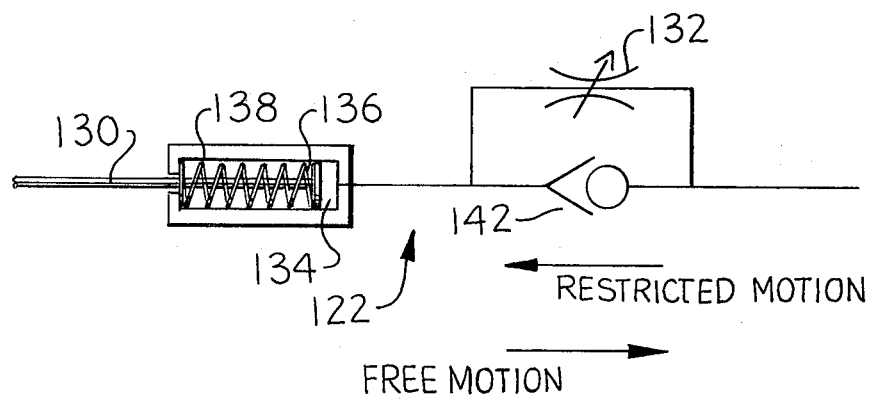
FIG. 11 is a schematic of the drive means of FIG. 10.

In FIG. 10, a fixed CRT 110, a fixed lens 112 and a fixed photographic plate 114, the latter two being portions of a camera 115, are combined with a glass plate image shifter 116. The image shifter 116 is moved between the two positions shown about a pivot 118 by a solenoid 120 and a spring biased dash pot 122. The solenoid when activated retracts its armature 124 which is connected by means of a spring 126 to an actuation arm 128 of the image shifter 116. This causes the image shifter 116 to move to the position shown in dashed outline. This movement is resisted however by the dash pot 122 which is shown schematically in FIG. 11.

The dash pot 122 includes a connecting arm 130 attached to the actuation arm 128. When biased by the retraction of the solenoid armature 124, air is allowed to escape through an adjustable valve 132 into a chamber 134 in the dash pot bounded by a piston 136 which is spring loaded by a compression spring 138 to the position shown in solid outline in FIG. 10. The adjustment of the valve 132 regulates the movement of the image shifter 116 and is normally adjusted so that a complete movement between the two positions shown can occur during the time that the shutter 140 of the camera 115 is open. When the solenoid 120 is deactivated, the spring 138 returns the piston 136 and its connecting arm 130 to the position shown in FIG. 10 in solid outline. This is possible because the air in the chamber 134 can escape through a check valve 142 relatively unimpeded. Therefore, the dash pot 122 provides restricted motion to the left in the orientation in FIG. 10 and free motion to the right. The movement of the image shifter 116 can be restricted by a moveable stop 144 so that the image displacement achieves the proper raster blend.

Figure 6:
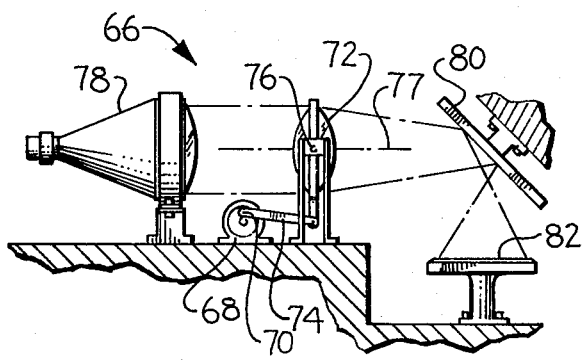
FIG. 6 is another embodiment of the present invention shown in diagrammatic form employing lens moving means.

It should be apparent that various components, as shown, can be interchanged to produce a usable device each with its own advantage. For example, drive motors tend to produce sinusoidal motion and, if properly designed, can run over a wide variety of speeds so that the smoothing movement of the image can be matched with the scan speed. Solenoids, on the other hand, can be adapted to the small, quick, and linear movements normally required by such a system. However, they are limited in power and dynamic inertial effects can limit their useful frequency range. The choice of what components, either individually or in consort, are used to produce the scan line smoothing movement also depends on the circumstances. For example, in FIG. 5, the CRT 34 is moved, however, if it is desirable to provide the image smoothing system as an add on feature, it is undesirable to modify the CRT 34 for movement. In FIGS. 6, 7 and 8 the mass of the imaging system components and the space available makes the choice of movement of the components depend upon the particular design circumstances. Therefore, none of the described systems can be said to be most advantageous in all situations.

Therefore there have been seen and described systems for smoothing the image of a CRT display for photographic reproduction which fulfill all the objects and advantages sought therefore. Many changes, modifications, variations, uses and other applications of the subject systems will become apparent to those skilled in the art after considering this specification and the accompanying drawing. All such changes, modifications, alterations and other uses and applications which do not depart from the spirit and scope of the invention are deemed to be covered by the invention which is limited only by the appended claims.

We claim:

1. A device to produce a photograph of an image represented by raster scans of variable intensity light having predetermined widths and predetermined spacing therebetween including:
a cathode ray tube having a face on which the raster scans of variable intensity light are produced thereacross in a first direction as its output representative of the image;
photographic means sensitive to the output of said cathode ray tube;
an imaging system to project the output of said cathode ray tube on said photographic means; and
mechanical means to move the output of said cathode ray tube with respect to said photographic means a distance about equal to the predetermined spacing between the raster scans in a second direction which generally is at right angles to said first direction.

2. The device as defined in claim 1 wherein said mechanical means include means to move said cathode ray tube at a right angle to said first direction.

3. The device as defined in claim 2 wherein said cathode ray tube has a neck, said means to move said cathode ray tube at a right angle to said first direction including:
a pivoted support connected about said face of said cathode ray tube;
a source of reciprocating motion; and means connecting said source of reciprocating motion to said neck of said cathode ray tube.

4. The device as defined in claim 3 wherein said means connecting said source of reciprocating motion to said neck of said cathode ray tube include linkage means and said source of reciprocating motion includes:
an electric motor; and
a crank output on said electric motor to which said linkage means is connected.

5. The device as defined in claim 4 wherein said electric motor is a variable speed electric motor.

6. The device as defined in claim 2 wherein said cathode ray tube has a neck, said means to move said cathode ray tube at a right angle to said first direction including:
a pivoted support connected about said face of said cathode ray tube;
a source of reciprocating motion; and
means connecting said source of reciprocating motion to said neck of said cathode ray tube, said source of reciprocating motion including:
an electric motor; and
an cam output on said electric motor to which said linkage means is connected.

7. The device as defined in claim 3 wherein said source of reciprocating motion includes a solenoid connected to said means connecting said source of reciprocating motion to said neck of said cathode ray tube.

8. The device as defined in claim 1 wherein said mechanical means include means to move said photographic means at a right angle to said first direction as projected on said photographic means by said imaging system.

9. The device as defined in claim 1 wherein said photographic means include:
linear movement mounting means allowing movement thereof at said right angle to said first direction as projected on said photographic means by said imaging system;
a source of reciprocating motion; and
means connecting said source of reciprocating motion to said photographic means.

10. The device as defined in claim 9 wherein said means connecting said source of reciprocating motion to said photographic means include linkage and said source of reciprocating motion includes:
an electric motor; and
a crank output on said electric motor to which said linkage is connected.

11. The device as defined in claim 9 wherein said means connecting said source of reciprocating motion to said photographic means include bias means and said source of reciprocating motion includes:
an electric motor; and
a cam output on said electric motor connected to said photographic means to act against said bias means.

12. The device as defined in claim 9 wherein said means connecting said source of reciprocating motion to said photographic means include linkage means and said source of reciprocating motion includes a solenoid connected to said linkage means.

13. The device as defined in claim 1 wherein said imaging system includes lens means, said mechanical means including means to move said lens means at right angles to said first direction as projected at said lens means.

14. The device as defined in claim 13 wherein said means to move said lens means at right angles to said first direction include:
a pivoted support connected to said lens means, said pivoted support having a pivot axis;
a source of reciprocating motion; and
linkage connecting said source of reciprocating motion to said lens means at a location thereon remote from said pivot axis of said pivoted support.

15. The device as defined in claim 14 wherein said source of reciprocating motion includes:
an electric motor; and
a crank output on said electric motor to which said linkage is connected.

16. The device as defined in claim 14 wherein said source of reciprocating motion includes:
bias means connected to said lens means;
an electric motor; and a cam output on said electric motor to which said linkage is connected to move said lens means against said bias means.

17. The device as defined in claim 14 wherein said source of reciprocating motion includes a solenoid connected to said linkage.

18. The device as defined in claim 14 wherein said lens means have a focal axis, said pivot means being connected to said lens means to allow pivoting thereof about a perpendicular to said focal axis.

19. The device as defined in claim 1 wherein said imaging system includes reflective means, said mechanical means including means to move said reflective means at right angles to said first direction as projected at said reflective means.

20. The device as defined in claim 19 wherein said means to move said reflective means at right angles to said first direction include:
a pivoted support connected to said reflective means, said pivoted support having an axis of rotation;
a source of reciprocating motion; and
linkage connecting said source of reciprocating motion to said reflective means at a location thereon remote from said axis of rotation of said pivoted support.

21. The device as defined in claim 20 wherein said source of reciprocating motion includes:
an electric motor; and
a crank output on said electric motor to which said linkage is connected.

22. The device as defined in claim 20 wherein said source of reciprocating motion includes:
an electric motor; and
a cam output on said electric motor to which said linkage is connected, said linkage including bias means to bias said reflective means in a circular direction about said pivot means, said cam output forcing said reflective means in the opposite circular direction about said pivot means.

23. The device as defined in claim 20 wherein said source of reciprocating motion includes a solenoid connected to said linkage.

24. The device as defined in claim 20 wherein said light output has a center and said reflective means has a center in alignment with said center of said light output projected thereon, said pivot means being connected to said reflective means to allow pivoting thereof about a perpendicular to said reflective means center.

25. The device as defined in claim 19 wherein said reflective means include a prism.

26. The device as defined in claim 1 wherein said mechanical means include:
force producing means which are electrically controllable resiliently connected to said imaging system to move the projected output on said photographic means; and
a dash pot connected to said imaging system to control the speed of movement thereof, said dash pot including means for restricting motion by said force producing means in a first direction and allowing relatively free motion in an opposite second direction.

27. The device as defined in claim 26 wherein said mechanical means further include:
a mechanical stop positioned to restrict the amount of motion said force producing means can impart to said imaging system.

28. The device as defined in claim 26 wherein said imaging system includes:
a glass plate image shifter mounted for pivoting in the output of said cathode ray tube to shift the output with respect to said photographic means, said glass plate image shifter being resiliently attached to said force producing means.

* * * * *